(12) United States Patent
Chen et al.

(10) Patent No.: US 7,871,742 B2
(45) Date of Patent: Jan. 18, 2011

(54) METHOD FOR CONTROLLING PHASE ANGLE OF A MASK BY POST-TREATMENT

(75) Inventors: Chun-Lang Chen, Tainan County (TW); Tran-Hui Shen, Yunlin County (TW); Fei-Gwo Tsai, Hsin-Chu (TW); Chien-Chao Huang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 709 days.

(21) Appl. No.: 11/697,015

(22) Filed: Apr. 5, 2007

(65) Prior Publication Data

US 2008/0248404 A1 Oct. 9, 2008

(51) Int. Cl.
*G03F 1/00* (2006.01)
(52) U.S. Cl. .............................. 430/5; 134/1
(58) Field of Classification Search .............. 430/5, 430/311, 322; 134/1, 26, 28, 29; 216/67
See application file for complete search history.

(56) References Cited

U.S. PATENT DOCUMENTS

| | | | |
|---|---|---|---|
| 6,348,288 B1 * | 2/2002 | Yu et al. .................... | 430/5 |
| 2004/0072081 A1 * | 4/2004 | Coleman et al. ............ | 430/5 |
| 2005/0208393 A1 * | 9/2005 | Dieu et al. ................. | 430/5 |
| 2006/0019178 A1 * | 1/2006 | Lee et al. ................... | 430/5 |
| 2006/0166108 A1 * | 7/2006 | Chandrachood et al. ..... | 430/5 |
| 2007/0012335 A1 * | 1/2007 | Chang et al. ............... | 134/1 |

\* cited by examiner

*Primary Examiner*—Mark F Huff
*Assistant Examiner*—Stewart A Fraser
(74) *Attorney, Agent, or Firm*—Haynes and Boone, LLP (57) ABSTRACT

A method for controlling phase angle of a mask is provided. A mask comprising a substrate and an absorber is formed. A nitrogen-containing plasma treatment is performed on the mask to reduce the phase angle. Alternatively, a nitrogen-containing plasma treatment is performed on the mask, followed by a vacuum ultraviolet treatment to form a passivated layer on the mask.

14 Claims, 7 Drawing Sheets

Fig. 8

METHOD FOR CONTROLLING PHASE ANGLE OF A MASK BY POST-TREATMENT

BACKGROUND

The present disclosure relates in general to semiconductor manufacturing technology, and more particularly, to process control of mask making in the semiconductor manufacturing technology. The present disclosure also relates to a method for controlling phase angle of a phase-shift mask by post-treatment in the semiconductor manufacturing process.

In semiconductor manufacturing technology, phase-shift masks (PSM) have been used to overcome problems associated with light diffraction through small openings patterned on the reticle. One example of PSMs is attenuated PSMs, which form their pattern through adjacent areas of quartz and molybdenum silicide (MoSi). Unlike chrome, MoSi allows small percentage of light to pass through the small openings. The thickness of MoSi is chosen so that the light passing through MoSi is 180 degrees out of phase with the light passing through the clear quartz areas. Even though the light passing through MoSi areas is too weak to expose the resist, the phase difference pushes the intensity down to be darker than similar features in chrome. As a result, a sharper intensity profile is provided, which allows smaller features to be printed on the wafer.

Phase shift or phase angle is expressed as a function of thickness of MoSi and quartz. The phase angle becomes larger as the thicknesses of the MoSi and quartz increase. In order to control the thickness of MoSi, the etching time of MoSi is monitored. In a traditional mask making process, after a patterned chrome mask is formed with a chromium plasma shield, a first etching is performed with $SF_6O_2$ plasma. A second etching or an over-etching is then performed with $SF_6O_2$ plasma on the patterned mask to control the critical dimension uniformity of the mask. After over-etching is completed, the chromium plasma shield is stripped and the circuit layout is formed on the PSM. However, once the PSM is complete, there is no way to adjust the phase angle in subsequent processing. Thus, if the phase angle of the PSM is out of specification because of the etching process, the whole PSM mask must be scrapped. In addition, subsequent mask cleaning process may also cause the MoSi loss, which leads to phase angle loss.

Therefore, a need exists for a method that controls phase angle of the PSM after all processes are completed, such that less PSMs will be scrapped due to processing defects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

DETAILED DESCRIPTION

For the purposes of promoting an understanding of the principles of the invention, reference will now be made to the embodiments, or examples, illustrated in the drawings and specific language will be used to describe the same. It will nevertheless be understood that no limitation of the scope of the invention is thereby intended. Any alterations and further modifications in the described embodiments, and any further applications of the principles of the invention as described herein are contemplated as would normally occur to one skilled in the art to which the invention relates. Furthermore, the depiction of one or more elements in close proximity to each other does not otherwise preclude the existence of intervening elements. Also, reference numbers may be repeated throughout the embodiments, and this does not by itself indicate a requirement that features of one embodiment apply to another embodiment, even if they share the same reference number.

Figure 1:
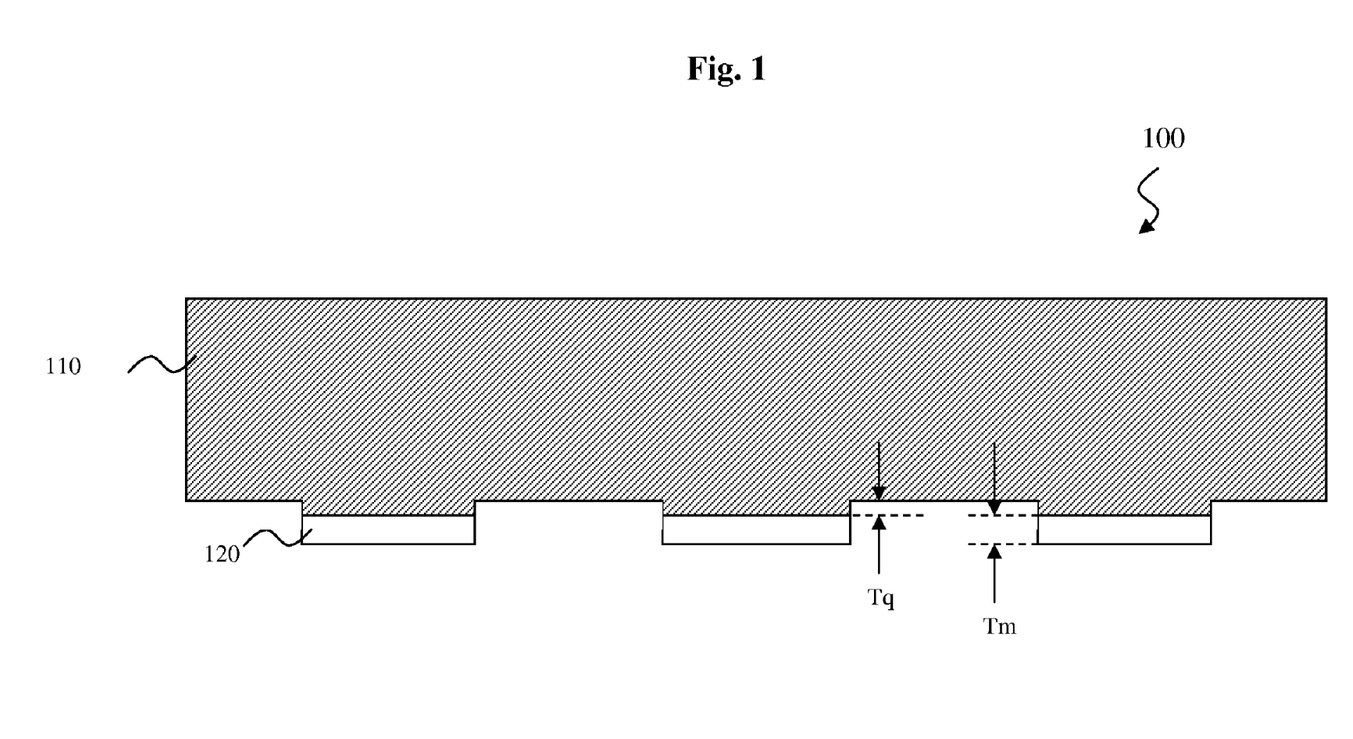
FIG. 1 is a diagram illustrating an exemplary phase shift mask.

Referring to FIG. 1 an exemplary phase shift mask (PSM) comprises areas of quartz 110 and absorber 120. The areas of absorber 120 are separated by the areas of quartz 110 through a process such as an etch process, discussed in greater detail below with respect to FIG. 2. In the present embodiment, the absorber 120 includes molybdenum silicide (MoSi) and allows a small percentage of light to pass through. A phase angle of the PSM 100 is expressed as a function of a thickness $T_q$ of quartz over-etch and thickness $T_m$ of the MoSi absorber. An example of the function is illustrated in equation (1):

$$\text{Phase angle} = 2\pi/2[(n_q-1)T_q + (n_m-1)T_m], \quad (1)$$

where $n_q$ and $n_m$ are the index of refraction for quartz and MoSi respectively.

Figure 2:
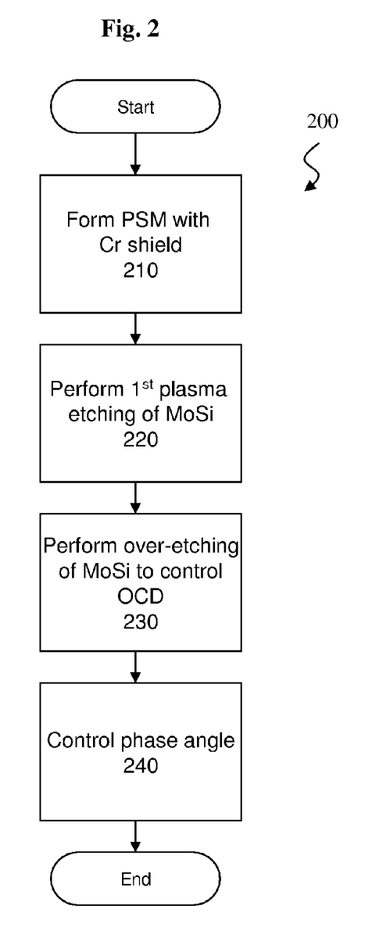
FIG. 2 is a flowchart of an exemplary process for controlling phase angle of a PSM.

Referring to FIG. 2, an exemplary mask making process 200 for controlling phase angle of a PSM begins at step 210 to form a patterned PSM mask with a chromium plasma shield. Process 200 then continues to step 220 to perform a first etching of MoSi with $SF_6O_2$ plasma. Process 200 continues to step 230 to perform an over-etching of MoSi with $SF_6O_2$ plasma on the patterned mask in order to control the critical dimension uniformity of the mask. After over-etching step 230, the mask is complete.

However, once the PSM is complete in step 230, there is no way to adjust the phase angle in subsequent processing. Thus, if the phase angle of the PSM is out of specification because of the etching process, the whole PSM mask must be scrapped. In addition, subsequent mask cleaning process may also cause the MoSi loss, which leads to phase angle loss. Aspects of the present disclose provide a method for controlling the phase angle of the PSM once it is completed by post-treatment. Turning back to process 200, after the mask is complete, execution proceeds to step 240 to control the phase angle of the mask. More details regarding step 240 are discussed with reference to FIGS. 3 and 6 below.

Figure 3:
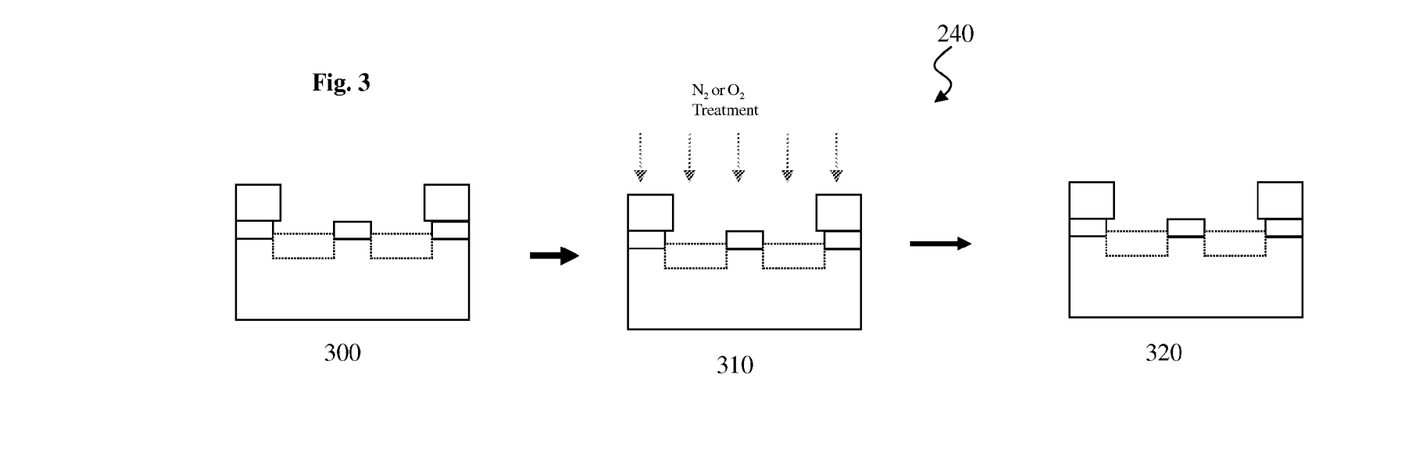
FIG. 3 is a flowchart of an exemplary process for controlling phase angle of the PSM is depicted in accordance with an illustrative embodiment of the present disclosure.

Referring to FIG. 3, a first embodiment of the process 240 for controlling phase angle of the PSM is depicted. Process 240 begins at step 300 after a completed PSM is formed. Next, process 240 continues to step 310 to perform a plasma treatment on the PSM to decrease the phase angle. In one embodiment, nitrogen-containing plasma, such as $N_2$ plasma, may be used to treat the PSM. Alternatively, an oxygen-containing plasma, such as $O_2$ plasma, may be used to treat the PSM. Process 240 then proceeds to step 320 to form a PSM with phase angle reduction.

Figure 4:
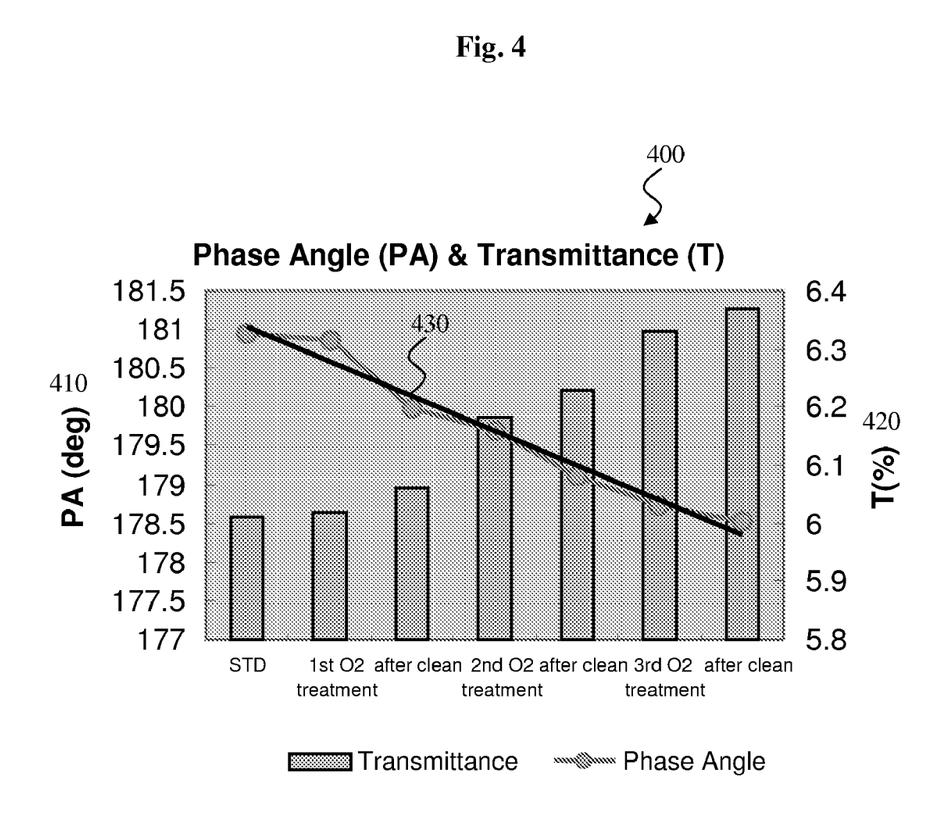
FIG. 4 is a graph illustrating the effects on phase angle and light transmittance after an oxygen-containing plasma is performed on the PSM

Referring to FIG. 4, graph 400 illustrates the effects on phase angle 410 and light transmittance 420 after an oxygen-containing plasma is performed on the PSM. As shown in graph 400, the phase angle continues to decline after multiple treatments of oxygen-containing plasma. In this example, a decreasing rate 430 of phase angle is about 0.44 degree per treatment or clean. Due to the decrease in phase angle, the light transmittance rate is increased by about 0.066 percent per treatment or clean. One example of oxygen-containing plasma treatment conditions comprise a source power from about 50 Watts to about 500 Watts, a bias power from about 5 Watts to 30 Watts, a reaction pressure from about 3 mT to about 8 mT, an oxygen gas flow from about 50 sccm to about 120 sccm, and a reaction time of about 25 seconds. Thus, with the oxygen-containing plasma treatment, the phase angle of PSM may be adjusted after all processing is completed.

Figure 5:
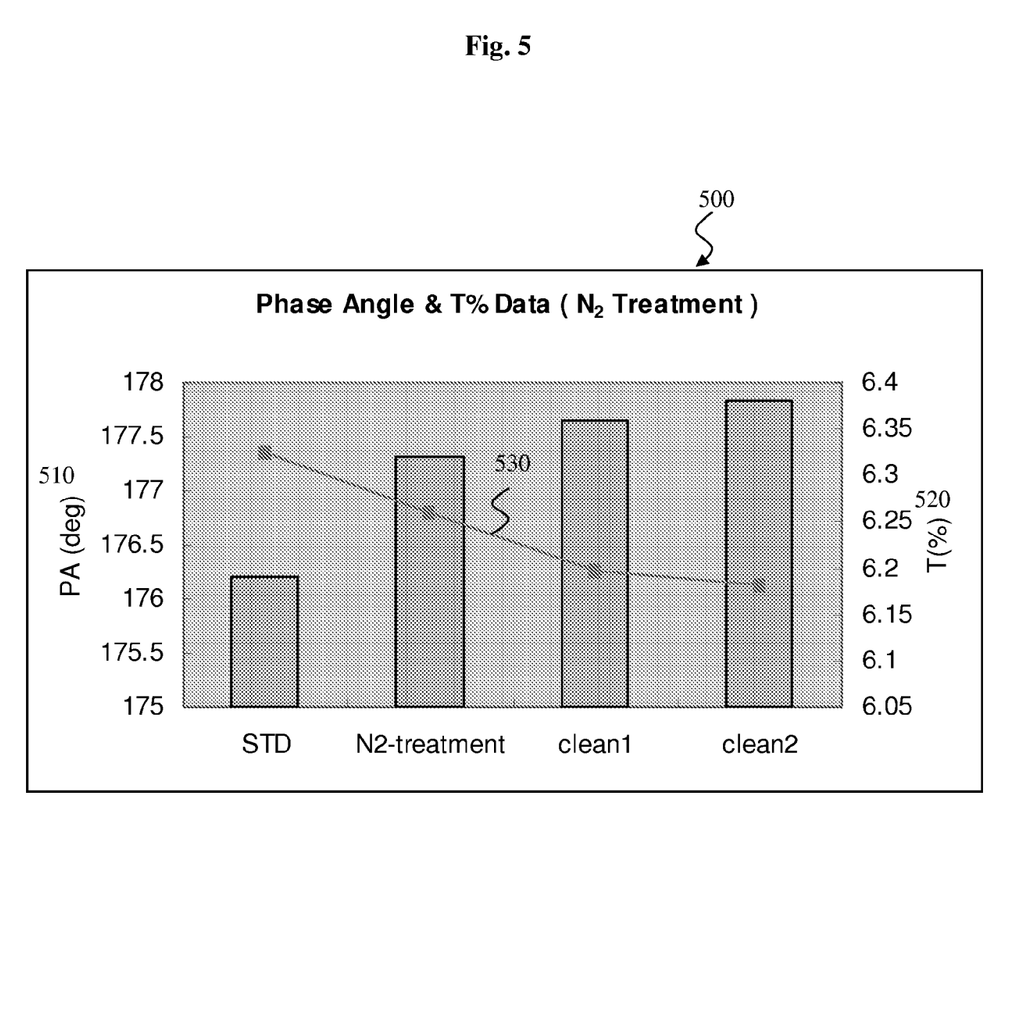
FIG. 5 is a graph illustrating the effects on phase angle and light transmittance after a nitrogen-containing plasma is performed on the PSM.

Referring to FIG. 5, a graph 500 illustrates the effects on phase angle 510 and light transmittance 520 after a nitrogen-containing plasma is performed on the PSM. As shown in graph 500, the phase angle continues to decline after a treatment of nitrogen-containing plasma and cleaning. In this example, the decreasing rate of phase angle 530 is about 1.09 degree per treatment or clean, which is more than twice the decreasing rate of phase angle from the oxygen-containing plasma treatment. Due to the decrease in phase angle, the light transmittance rate is increased by about 0.17 percent per treatment or clean. One example of nitrogen-containing plasma treatment conditions comprise a source power from about 50 Watts to about 500 Watts, a bias power from about 5 Watts to about 30 Watts, a reaction pressure from about 3 mT to about 8 mT, a nitrogen gas flow from about 50 sccm to 120 sccm, and a reaction time of about 30 seconds. Thus, with the nitrogen-containing plasma treatment, the phase angle of PSM may also be adjusted after all processing is completed.

Figure 6:
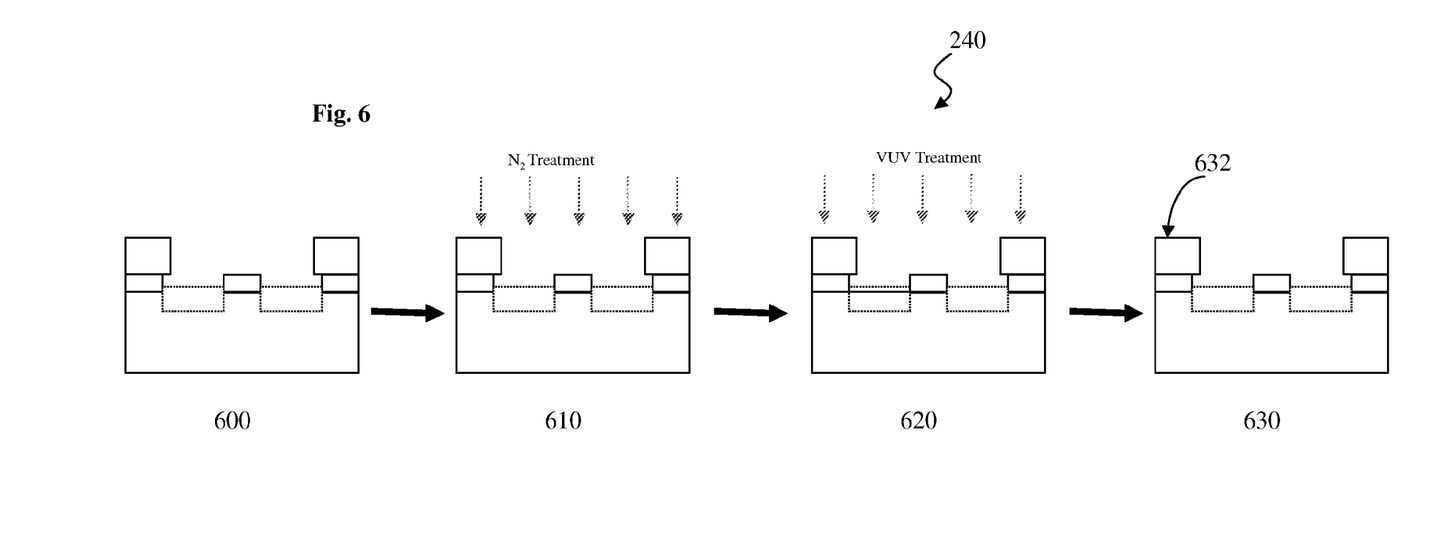
FIG. 6 is a flowchart of an exemplary process for controlling phase angle of the PSM in accordance with another illustrative embodiment of the present disclosure.

As discussed above, the traditional mask cleaning process may also cause phase angle loss due to the loss of MoSi film thickness. Aspects of the present disclose provides a method to prevent such phase angle loss by providing a passivated layer on or over the patterned MoSi film of the PSM. Referring to FIG. 6, another embodiment of the process 240 for controlling phase angle of the PSM is depicted. Process 240 begins at step 600 after a complete PSM is formed. At step 610, a nitrogen-containing plasma treatment is performed on the PSM. In one embodiment, nitrogen-containing plasma, such as $N_2$ plasma, may be ignited to treat the PSM under conditions mentioned above. During the treatment, strong $N_2$ ions strike the surface of the PSM causing a slightly damaged PSM layer that comprises MoSiNx.

Process 240 then proceeds to step 620 to perform high energy vacuum ultraviolet (VUV) treatment to produce a protective passivated layer. During the treatment, a high energy VUV light, such as 172 nm wavelength VUV, excites the oxygen in a process chamber and diffuses the excited oxygen deep into the damaged MoSiNx layer. A photo-reaction occurs between the damaged MoSiNx layer and the excited oxygen, which produces a protective layer on the MoSiNx layer. Process 240 then continues to step 630 to form a PSM with a protective layer 632 to protect against subsequent cleaning.

Figure 7:
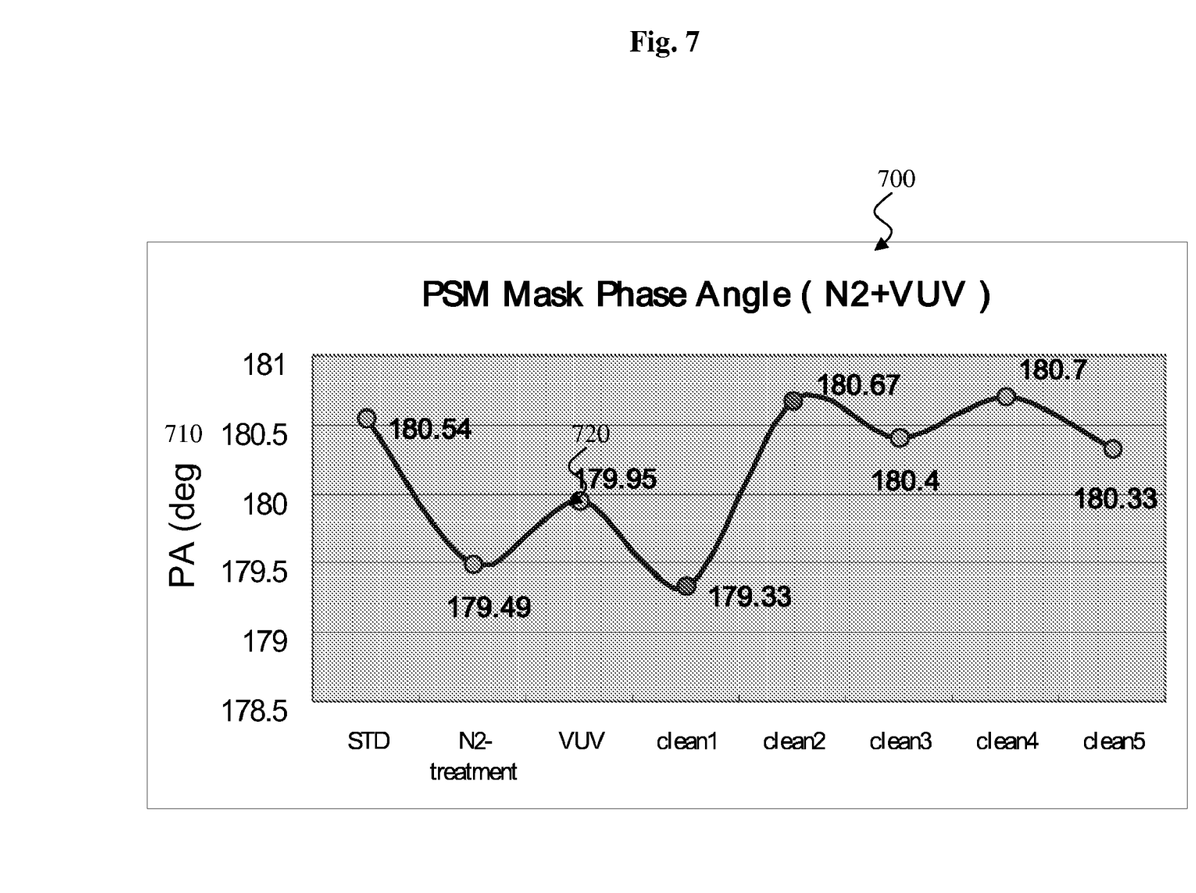
FIG. 7 is a graph illustrating the effects on phase angle after a nitrogen-containing plasma and high energy vacuum ultraviolet (VUV) treatment are performed on the PSM.

Referring to FIG. 7, a graph 700 illustrates the effects on phase angle 710 after a nitrogen-containing plasma and high energy VUV treatment are performed on the PSM. As shown in graph 700, the phase angle declines after a treatment of nitrogen-containing plasma and high energy VUV. In this example, the phase angle 720 decreases about 0.59 degree after the nitrogen-containing plasma treatments. Subsequently, the post-treatment PSM is cleaned several times. The phase angle is increased by about 1.34 degree. Thus, after a nitrogen-containing plasma and high energy VUV treatment, a protective layer comprising MoSiNx is formed, which protects the PSM from subsequent cleaning loss. With this protective layer, there is almost no phase angle loss even after several cleaning are performed on the PSM.

Figure 8:
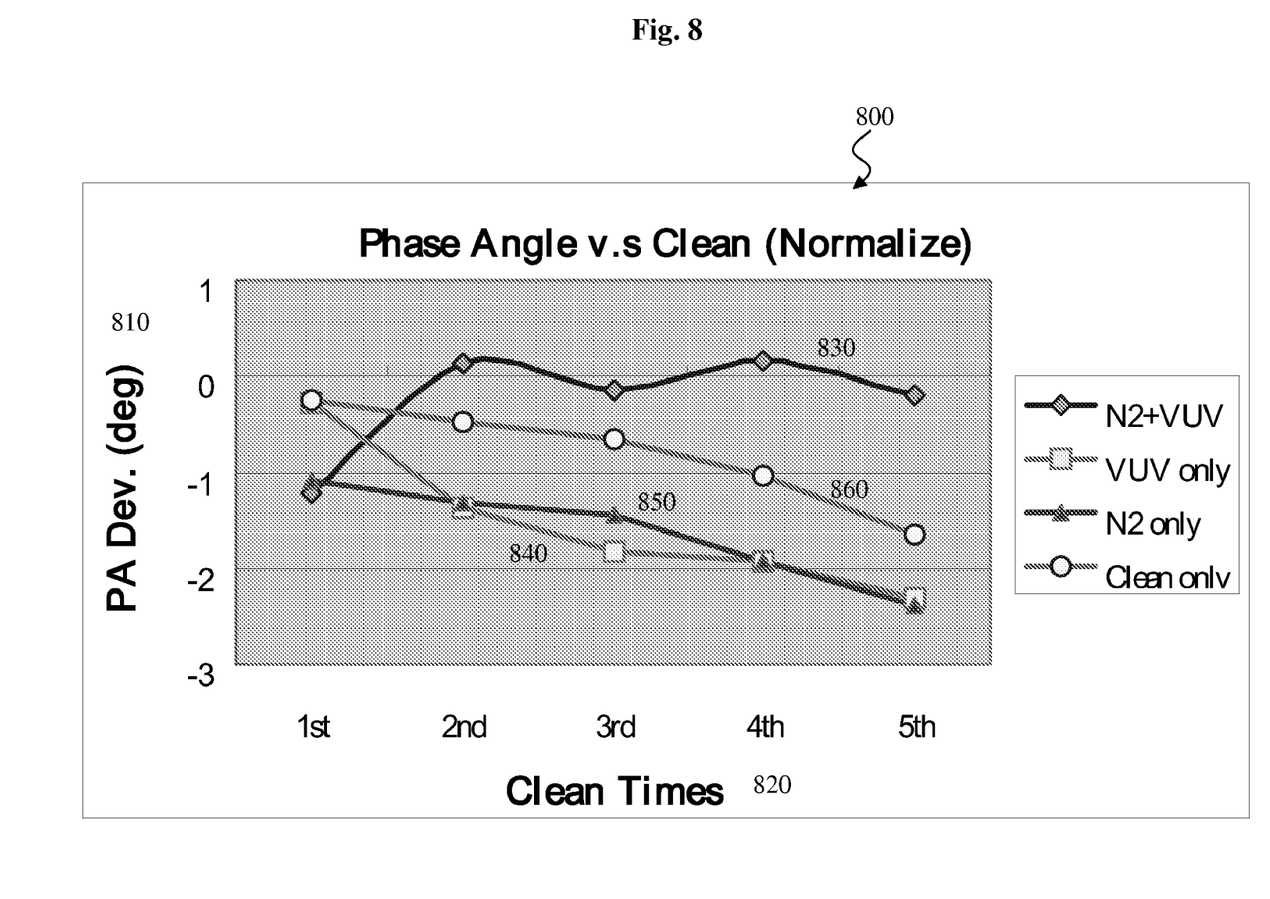
FIG. 8 is a graph illustrating the effects on phase angle after multiple cleaning with different treatments performed on the PSM.

Referring to FIG. 8, a graph 800 illustrates the effects on phase angle 810 after multiple cleaning with different treatments performed on the PSM. As shown in graph 800, the phase angle increases after the second cleaning with a treatment 830 of nitrogen-containing plasma and high energy VUV. After the fifth cleaning with both treatments, there is almost no phase angle loss. In this example, the decreasing rate of phase angle is about 0.072 degree per cleaning. This is contrasted with the effects on phase angle 810 after the fifth cleaning with high energy VUV treatment alone 840, which has a phase angle decreasing rate of about 0.29 degree per cleaning; with nitrogen-containing plasma alone 850, which has a phase angle decreasing rate of about 0.374 degree per cleaning; and with cleaning alone 860, which has a phase angle decreasing rate of about 0.395 degree per cleaning. The phase angle loss with these treatments are much higher than the phase angle loss with treatment of nitrogen-containing plasma and high energy VUV combination. In other words, neither nitrogen-containing plasma nor high energy VUV treatment alone can prevent phase angle loss from subsequent cleaning. However, a combination of nitrogen-containing plasma and high energy VUV treatment may prevent phase angle loss from subsequent cleaning.

In summary, aspects of the present disclose provides a method for controlling the phase angle of a mask by post-treatment. In one embodiment, a nitrogen or oxygen-containing plasma may be performed to decrease the phase angle. In this way, final phase angle may be reduced rapidly without causing significant mask feature movement or produce additional mask pattern damage. In one example, the time required to decrease the phase angle is about one hour. In addition, the critical dimension uniformity of PSM after the nitrogen-containing plasma treatment is about 0.46 nm, which is better than 1 nm as required by the specification. Also, no significant defects are detected after the nitrogen-containing plasma treatment is performed.

In an alternative embodiment, a protective layer on MoSi film is provided to prevent phase angle loss from subsequent cleaning by performing a combination of nitrogen-containing plasma and high energy VUV treatment. The protective layer has a good anti-clean effect, which gives a more stable PSM. By preventing phase angle loss from subsequent cleaning, out of specification PSMs may be salvaged and the lifetime of PSMs are extended. In addition, mask cleaning time may increase without the burden of phase angle loss. It is noted that in addition to phase shift mask (PSM), aspects of the present disclosure may be implemented on other types of mask without departing the spirit and scope of the present disclosure.

In one embodiment, a method for controlling phase angle of a mask is provided. A mask comprising a substrate and an absorber is formed. A nitrogen-containing plasma treatment is performed on the mask to reduce the phase angle. To form a mask, a mask with a chromium shield is formed, a first etching of the absorber is performed, an over-etching of the absorber to control critical dimension of the mask is performed, and a photoresist deposited over the mask is removed.

To perform the nitrogen-containing plasma treatment, a source power from about 50 Watts to about 500 Watts is provided into a chamber, a bias power from about 5 Watts to about 30 Watts is provided into the chamber, a reaction pressure from about 3 mT to about 8 mT is provided into the chamber, a nitrogen gas is flowed at a flow rate from about 50 sccm to about 120 sccm in the chamber, and the mask is provided in the chamber for about 30 seconds.

In another embodiment, a method for controlling phase angle of a mask is provided. A mask comprising a substrate and an absorber is formed, and an oxygen-containing plasma treatment is performed on the mask to reduce the phase angle. The oxygen-containing plasma is a $O_2$ plasma. To perform a oxygen-containing plasma treatment, a source power from about 50 Watts to about 500 Watts is provided into a chamber. A bias power from about 5 Watts to 30 Watts is provided into the chamber. A reaction pressure from about 3 mT to about 8 mT is provided into the chamber. An oxygen gas is flowed at a flow rate from about 50 sccm to about 120 sccm in the chamber, and the mask is provided in the chamber for about 25 seconds.

In yet another embodiment, a method for controlling phase angle of a mask is provided. A mask comprising a substrate and an absorber is formed. A nitrogen-containing plasma treatment is performed on the mask. A vacuum ultraviolet treatment is performed to form a passivated layer on the mask. A plurality of cleaning of the mask is performed. The passivated layer comprises MoSiNx. Performing a nitrogen-containing plasma treatment decreases the phase angle of the mask and performing a vacuum ultraviolet treatment increase the phase angle of the mask after the plurality of cleaning are performed.

In yet another embodiment, a mask for controlling phase angle loss is provided. The mask comprises a substrate, an absorber layer formed on portions of the substrate, and a passivated layer formed on the absorber layer. The absorber layer comprises MoSi and the passivated layer comprises MoSiNx. The passivated layer protects the mask from phase angle loss from subsequent cleaning.

It is to be understood that the following disclosure provides different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not itself dictate a relationship between various embodiments and/or configurations discussed.

What is claimed is:

1. A method for controlling a phase angle of a phase shift mask, the method comprising:
   forming the phase shift mask comprising a substrate and a patterned absorber layer; and
   performing a nitrogen-containing plasma treatment on the formed mask, the nitrogen-containing plasma treatment configured to reduce the phase angle of the formed mask, wherein the nitrogen-containing plasma treatment uses:
   a source power from about 50 Watts to about 500 Watts;
   a bias power from about 5 Watts to about 30 Watts;
   a reaction pressure from about 3 mT to about 8 mT;
   a nitrogen gas flow rate from about 50 sccm to about 120 sccm; and
   a time from about 1 second to about 30 seconds.

2. The method of claim 1, wherein forming the phase shift mask comprises:
   depositing a photoresist;
   forming the phase shift mask with a chromium shield;
   performing a first etching of an absorber layer to create the patterned absorber layer;
   performing an over-etching of the patterned absorber layer; and
   removing un-etched portions of the photoresist deposited over the phase shift mask.

3. The method of claim 1, wherein the nitrogen-containing plasma is a $N_2$ plasma.

4. The method of claim 1, further comprising:
   creating a protective layer over the patterned absorber layer.

5. The method of claim 1, wherein the patterned absorber layer includes MoSi.

6. The method of claim 1, wherein the performing the nitrogen-containing plasma treatment includes configuring the nitrogen-containing plasma treatment to reduce the phase angle of the phase shift mask at a rate of about 1.09 degree per nitrogen-containing plasma treatment.

7. A method for controlling phase angle of a mask, the method comprising:
   forming a phase shift mask comprising a substrate and a patterned absorber layer; and
   performing an oxygen-containing plasma treatment on the formed mask, the oxygen-containing plasma configured to reduce the phase angle of the formed mask, wherein the oxygen-containing plasma treatment uses:
   a source power from about 50 Watts to about 500 Watts;
   a bias power from about 5 Watts to about 30 Watts;
   a reaction pressure from about 3 mT to about 8 mT;
   an oxygen gas flow rate from about 50 seem to about 120 seem; and
   a time from about 1 second to about 25 seconds.

8. The method of claim 7, wherein the oxygen-containing plasma is an $O_2$ plasma.

9. The method of claim 7, wherein the performing the oxygen-containing plasma treatment includes configuring the oxygen-containing plasma treatment to reduce the phase angle at a rate of about 0.44 degree per oxygen-containing plasma treatment.

10. A method for controlling phase angle of a mask, the method comprising:
    forming a mask comprising a substrate and an absorber;
    performing a first nitrogen-containing plasma treatment on the formed mask; and
    performing a first vacuum ultraviolet treatment, wherein the first nitrogen-containing plasma treatment and the first vacuum ultraviolet treatment are configured to form a passivated layer on the formed mask that prevents phase angle loss of the formed mask during subsequent cleaning processes.

11. The method of claim 10, further comprising:
    performing a first cleaning of the formed mask;
    performing a second nitrogen-containing plasma treatment on the formed mask;
    performing a second vacuum ultraviolet treatment on the formed mask; and
    performing a second cleaning of the formed mask.

12. The method of claim 10, wherein the passivated layer comprises $MoSiN_x$, wherein x is an integer.

13. The method of claim 10, wherein the performing the first nitrogen-containing plasma treatment includes performing a nitrogen-containing plasma treatment that is configured to decrease the phase angle of the formed mask.

14. The method of claim 10, wherein the performing the first nitrogen-containing plasma treatment and performing the first a vacuum ultraviolet treatment includes configuring the nitrogen-containing plasma treatment/first vacuum ultraviolet treatment combination to increase the phase angle of the formed mask during an initial cleaning process and stabilize the phase angle of the formed mask during a subsequent cleaning process, such that the passivated layer on the formed mask prevents phase angle loss.

* * * * *